United States Patent
Leonhardt

(10) Patent No.: US 7,069,527 B1
(45) Date of Patent: Jun. 27, 2006

(54) ALGORITHM FOR FULL-CHIP RESISTANCE EXTRACTION

(75) Inventor: Goetz E. Leonhardt, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/212,513

(22) Filed: Aug. 24, 2005

(51) Int. Cl.
*G06F 17/50* (2006.01)

(52) U.S. Cl. .......................... 716/4; 703/14
(58) Field of Classification Search ............ 716/4, 716/5; 703/14
See application file for complete search history.

(56) References Cited

U.S. PATENT DOCUMENTS

| | | | |
|---|---|---|---|
| 5,999,726 A * | 12/1999 | Ho ............... | 716/11 |
| 6,185,722 B1 * | 2/2001 | Darden et al. ............... | 716/5 |
| 6,453,444 B1 * | 9/2002 | Shepard ....................... | 716/2 |
| 6,854,103 B1 * | 2/2005 | Teene ......................... | 716/11 |
| 2004/0225485 A1 * | 11/2004 | Lowther et al. ............. | 703/15 |
| 2004/0225975 A1 * | 11/2004 | Pramono ...................... | 716/5 |

* cited by examiner

*Primary Examiner*—Evan Pert
(74) *Attorney, Agent, or Firm*—Martine Penilla & Gencarella, LLP

(57) ABSTRACT

A method to convert a wire layout geometry to a filament topology for determination of chip resistance is provided. The method includes resolving overlap of layout segments of the wire layout geometry and inserting a vertical filament into each of the layout segments. The method further includes connecting vertical filaments using lateral connections and merging connected parallel filaments. The method also includes removing open filaments and modifying the filament structure in a bend region based on relative dimensions of the vertical filaments within the bend region.

24 Claims, 9 Drawing Sheets

ALGORITHM FOR FULL-CHIP RESISTANCE EXTRACTION

BACKGROUND

1. Field of the Invention

The present invention relates to determining chip resistance model, and more specifically to full-chip resistance extraction.

2. Description of the Related Art

Resistance values of on chip wiring are often used for signal timing and signal noise analysis. For performance reasons, full chip resistance extraction is often based on wire layout geometry. Once a certain layout geometry is encountered, a corresponding resistance model is often reported. In addition, typical parasitic resistance extraction algorithms generally have the relation of layout and resistor model hardcoded. With changing technology and downstream tool requirements, current resistance models are often no longer accurate. Unfortunately, translating models is often difficult to achieve. Thus, resistance determination when layout of wires on a chip are changed can be difficult.

Generally, to obtain a resistance model, a purely mathematical model may be utilized with every change in layout geometry. Unfortunately, usage of mathematical models for every portion of the geometric layout is complex and difficult. Consequently, determining the resistance models for a new chip design can take a lengthy period of time and therefore, can increase the cost of new chip designs.

Consequently, there is a need for a new method where determining resistance models can be accomplished in a less complex and time consuming manner. Accordingly, what is needed is an apparatus and a method for translating layout into resistance models in an accurate and intelligent manner.

SUMMARY OF THE INVENTION

Broadly speaking, the present invention is an apparatus and a method for intelligently translating wire geometry into a filament topology which may be utilized to determine resistance values of chip wiring. It should be appreciated that the present invention can be implemented in numerous ways, such as a process, an apparatus, a system, a device or a method on a computer readable medium. Several inventive embodiments of the present invention are described below.

In one embodiment, a method to convert a wire layout geometry to a filament topology for determination of chip resistance is provided. The method includes resolving overlap of layout segments of the wire layout geometry and inserting a vertical filament into each of the layout segments. The method further includes connecting vertical filaments using lateral connections and merging connected parallel filaments. The method also includes removing open filaments and modifying the filament structure in a bend region based on relative dimensions of the vertical filaments within the bend region.

In another embodiment, a computer readable media having program instructions to convert a wire layout geometry to a filament topology for determination of chip resistance. The computer readable media includes program instructions for resolving overlap of layout segments and program instructions for inserting a vertical filament into each of the layout segments. The computer readable media further includes program instructions for connecting vertical filaments using lateral connections and program instructions for merging connected parallel filaments. The computer readable media also includes program instructions for removing open filaments and program instructions for modifying a filament structure in a bend region based on relative dimensions of adjacent vertical filaments within the bend region.

In yet another embodiment, a method to convert a wire layout geometry to a filament topology for determination of chip resistance is provided. The method includes resolving overlap of layout segments and inserting a vertical filament into each of the layout segments. The method further includes connecting vertical filaments using lateral connections and merging connected parallel filaments. The method also includes removing open filaments and modifying a filament structure within a bend region including generating a particular filament structure in the bend region. The particular filament structure corresponds to particular dimensional ratios of adjacent vertical filaments within the bend region.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION

The following embodiments describe an apparatus and method for translating wire geometry into a filament topology which may be utilized to determine resistance values of chip wiring. It will be obvious, however, to one skilled in the art, that the present invention may be practiced without some or all of these specific details. In other instances, well known process operations have not been described in detail in order not to unnecessarily obscure the present invention.

The present invention includes a method for extracting resistance of chip wiring by translating a chip layout geometry into a resistor network. A resistor network consists of resistors and nodes. This network is needed for subsequent noise and timing simulation during back-end design verification. The purpose of this algorithm is to make it easier to change resistor models for corresponding layout geometries. Different models, which include like models with different accuracy, are often used for different downstream tools and for different manufacturing technologies.

The present invention translates the wire geometry into a filament topology to enable intelligent and less time consuming mathematical analysis of chip resistance. FIGS. 1 through 9 illustrate a method for conversion of wire geometry into the filament topology. After the conversion has been completed, resistance algorithms known can determine resistance values from the filament topology thereby accomplishing full chip resistance extraction.

Figure 1:
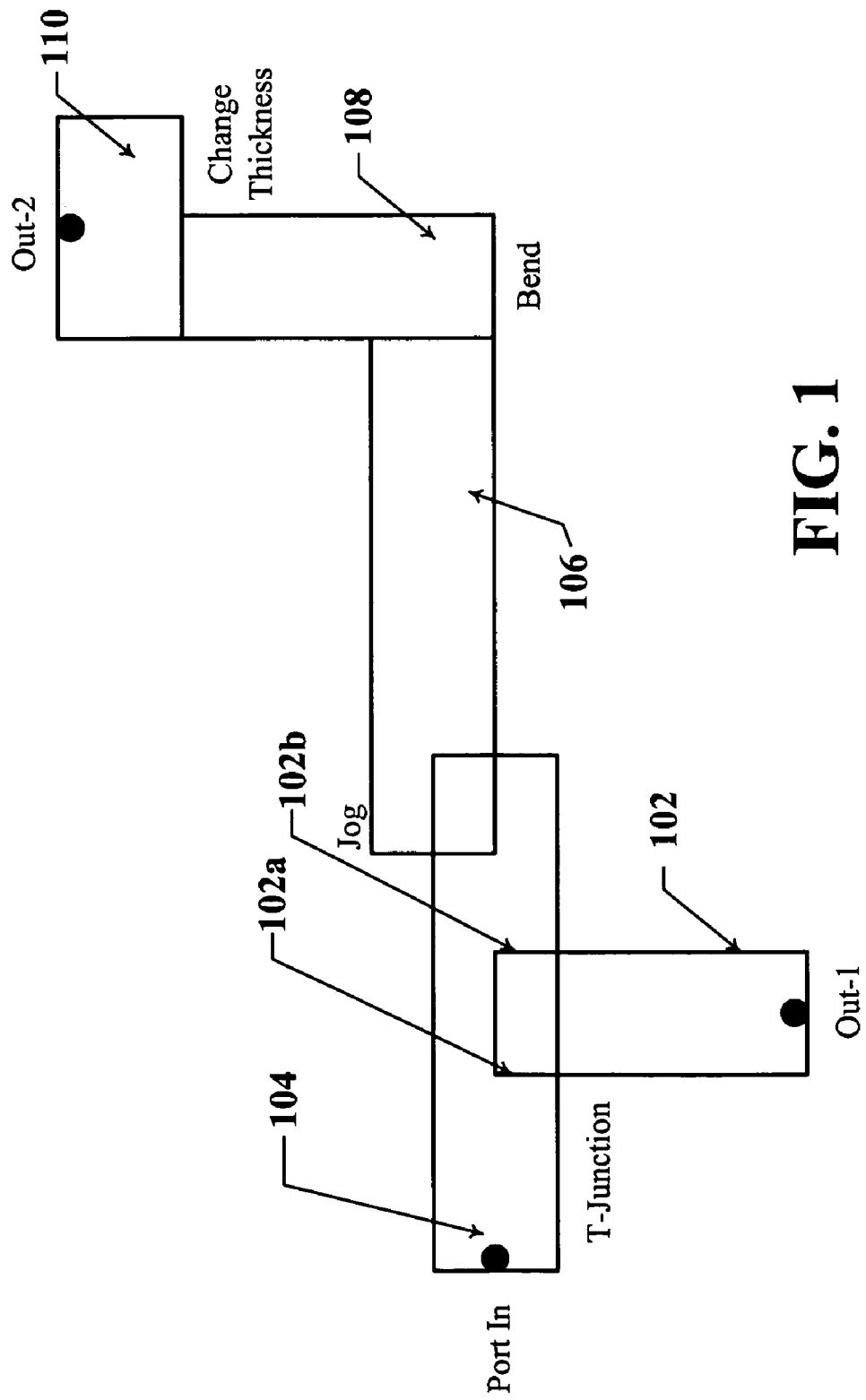
FIG. 1 shows a set of overlapping layout segments in accordance with one embodiment of the present invention.

FIG. 1 shows a set of overlapping wire layout segments 102, 104, 106, 108, and 110 in accordance with one embodiment of the present invention. In one embodiment, FIG. 1 represents metallization lines in an interconnect layer. It should be appreciated that the wire geometry shown in FIG. 1 is exemplary in nature and any other suitable wire geometry and/or arrangement may be utilized in conjunction with the methodologies described herein. In one exemplary embodiment, the overlapping layout may include ports in, out_1, and out_2. In the example shown in FIG. 1, overlaps such as, for example, segments 102a and 102b may exist which are resolved as discussed below. The connecting net geometry may have one or more of a t-junction, a bend, a job, and/or a change of wire thickness. All of these features are often utilized for net geometries and need to be considered during resistance extraction.

A typical translation algorithm computes the contour of the net geometry first. It then places nodes at inward corners of the contour. Starting from these nodes it inserts cuts across the conductor, ending at the opposite boundary of the conductor. This procedure results in different scenarios. Left and right of the cut may be different layout features (straight wire, bend, jog, etc.). Models may then be applied for each feature, resulting in a resistor. These resistors are connected at the previously inserted nodes, forming the final resistor network. An approach for resistance extraction is the use of sheet resistance R_s where R=R_s*l/w where l is the segment length, w the width and R is the resulting segment resistance. This formula is applicable for straight lines. The present invention as described herein clearly separates geometric extraction (i.e., translation of wire layout geometry to filament topology as described below) and algorithmic resistor models.

As shown in FIG. 1, each wire segment is shown as polygons. It should be appreciated that the wire layout geometry may be any suitable shape that can be used with the methodology described herein. In one embodiment, each of the wire layout segments 102, 104, 106, 108, 110, and 112 is a rectangular shape. In the wire layout geometry, there may include overlaps which, in one embodiment, are resolved as discussed in further detail in reference to FIG. 2.

Figure 2:
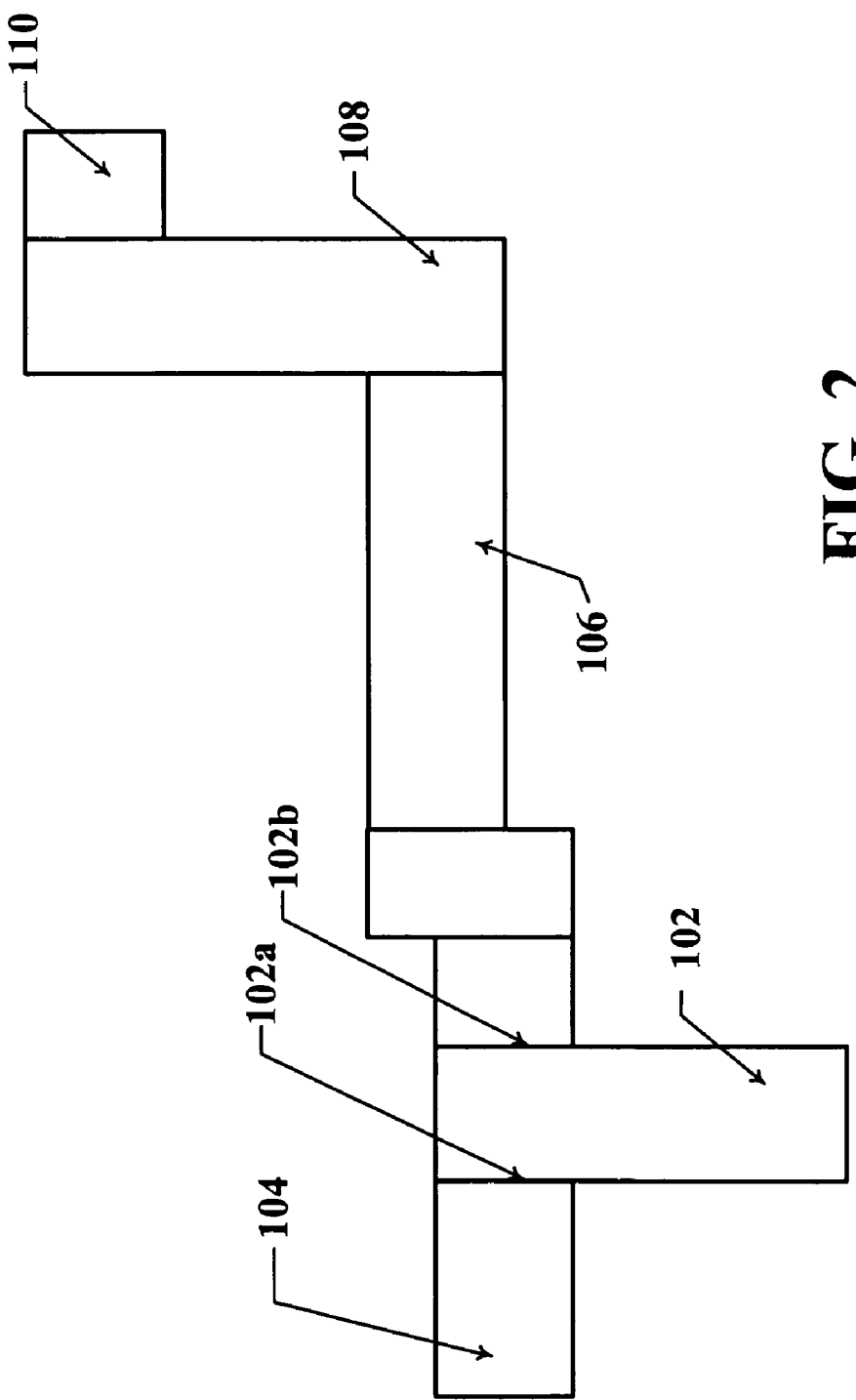
FIG. 2 shows a result of resolve overlap operation in accordance with one embodiment of the present invention.

FIG. 2 shows a result of resolve overlap operation in accordance with one embodiment of the present invention. The resolve overlap operation includes resolving all overlap of the layout segments of the wire layout geometry of FIG. 1. This operation includes eliminating overlaps of the segments and including vertical filaments in locations were the overlaps existed such as, for example, segments 102a and 102b. For the overlapping process, all the edges in the layout may be examined and a grid structure can be generated. The graph may be composed of all of the edges. The edges are in the y-direction and they may be sorted according to an x-axis where the edges make up a grid structure. For each grid line, the corresponding original segment is known so the active grid elements can be marked. Therefore, vertical segments such as, for example, segments 102a and 102b are extended to a cover a full width of a section 104. Therefore, vertical segments replace the portions of segments that overlapped.

Figure 3:
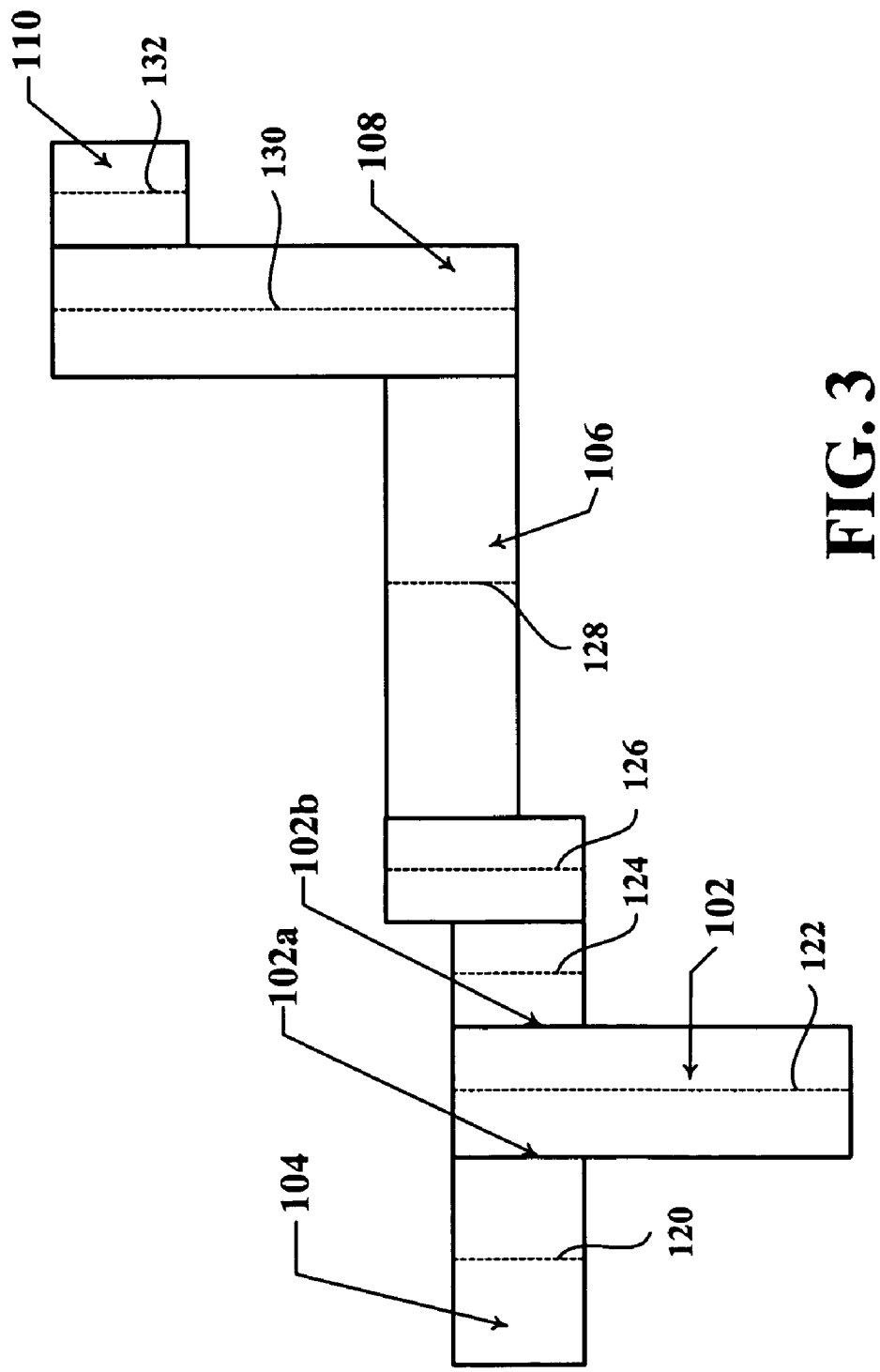
FIG. 3 illustrates a result of insertion of vertical filaments in accordance with one embodiment of the present invention.

FIG. 3 illustrates a result of insertion of vertical filaments 120, 122, 124, 126, 128, 130, and 132 in accordance with one embodiment of the present invention. In one embodiment, a layout geometry such as shown in FIG. 2 is translated into a set of filaments. Each filament may be defined as a line with a length and a width property with nodes at the start and end. In one embodiment, filament widths at bends may be determined during topology extraction of the wires and this data may be utilized to determine parasitic resistance.

The method described herein may determine a topology of the filaments and extract resistance based on the topology. Therefore, in one exemplary embodiment, a layout geometry may be translated into a set of filaments 102, 104, 106, 108, and 110. A filament may be a line that contains a length and width information and a start and end node (e.g., direction). In one embodiment, a filament may be connected to other filaments as shown below in reference to FIG. 4. These filaments can then be traversed like a graph to determine a resistor network. Therefore, resistor network generation can be performed while traversing the graph of filaments. By analyzing a net geometry in this fashion, changing the models or introducing new models for more complicated layout features like 2 nearby bends may be accomplished by changing the rules for traversing the filament graph.

In one embodiment, vertical filaments 120, 122, 124, 126, 128, 130, and 132 are marked in the middle of all segments in the structure shown in FIG. 2. In one embodiment, the vertical filaments 120, 122, 124, 126, 128, 130, and 132 may be generated by examining the start node and the end node of each rectangle. The start node may be on the lower side of each rectangle and the end node may be the upper end of each rectangle. The length of the vertical filament is the distance between the start and end node. The width of the vertical filament may correspond to the distance of the axis perpendicular to the axis defined by a line from the start node and the end node of the rectangle. The vertical filaments which are generated therefore completely covers the layout. This results in a structure of FIG. 3 where the overlaps in the original structure has been resolved to eliminate overlaps and each of the resultant segments include vertical filaments.

Figure 4:
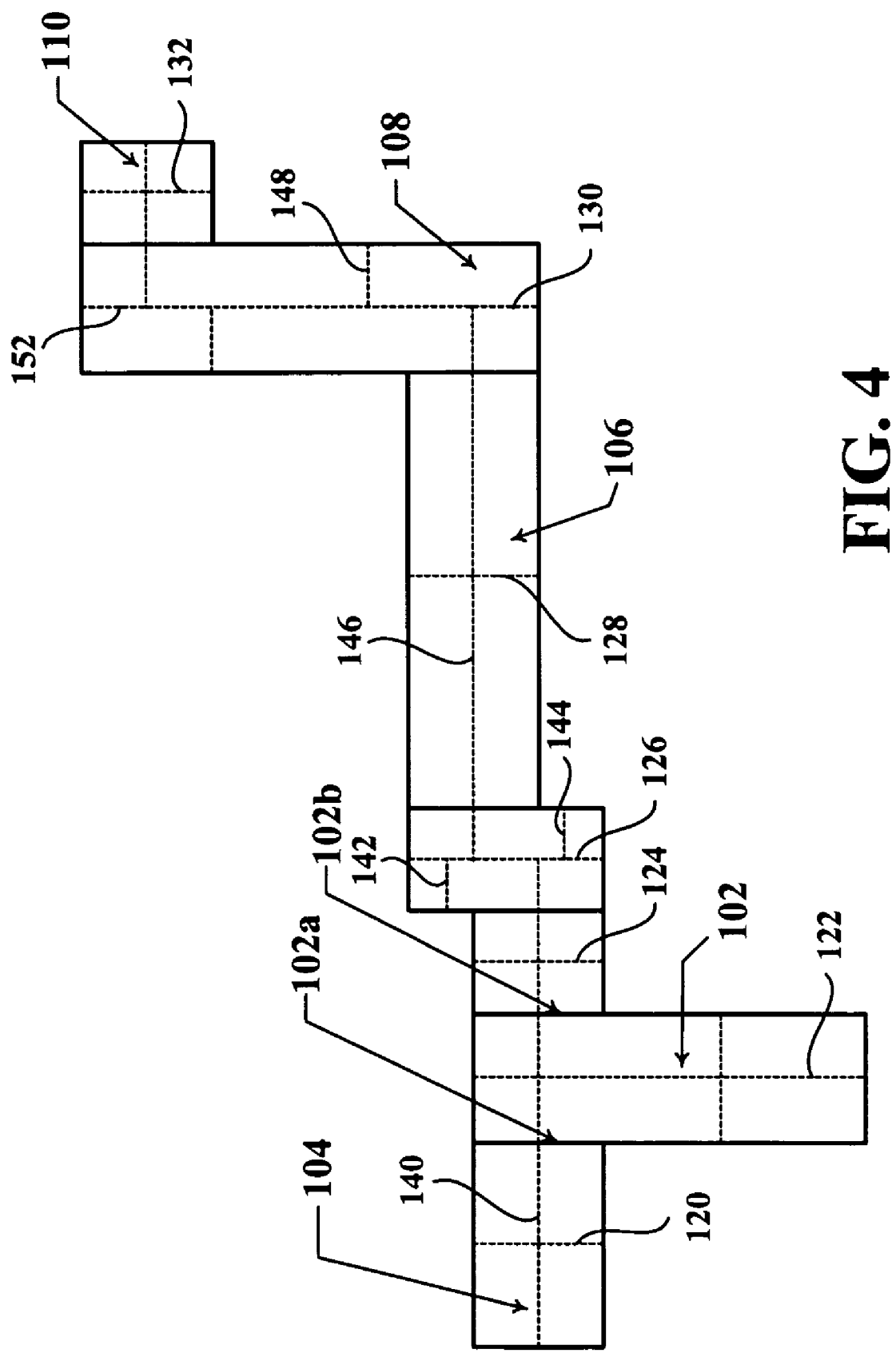
FIG. 4 shows an operation where the vertical filaments as shown in FIG. 3 are connected in accordance with one embodiment of the present invention.

FIG. 4 shows an operation where the vertical filaments 120, 122, 124, 126, 128, 130, and 132 as shown in FIG. 3 are connected in accordance with one embodiment of the present invention. In this operation, vertical filaments 120, 122, 124, 126, 128, 130, and 132 formed as shown in FIG. 3 are connected so later connections are added between neighboring vertical filaments and between vertical filaments and open boundaries. Therefore, in one exemplary embodiment, lateral connections 140, 142, 143, 144, 146, 148, 150, and 152 may be added to the layout. A particular lateral connection could either start at the midpoint of the vertical filament and extend to the outside edge or another type of lateral connection may extend from one vertical filament to the next neighboring vertical filament. In one embodiment, a horizontal connection is made in the center of the overlap region of neighboring vertical filaments or an open boundary. As shown in FIG. 4, each of the lateral connections along an x-axis is shown by a line through the middle of each of the segments.

Figure 5:
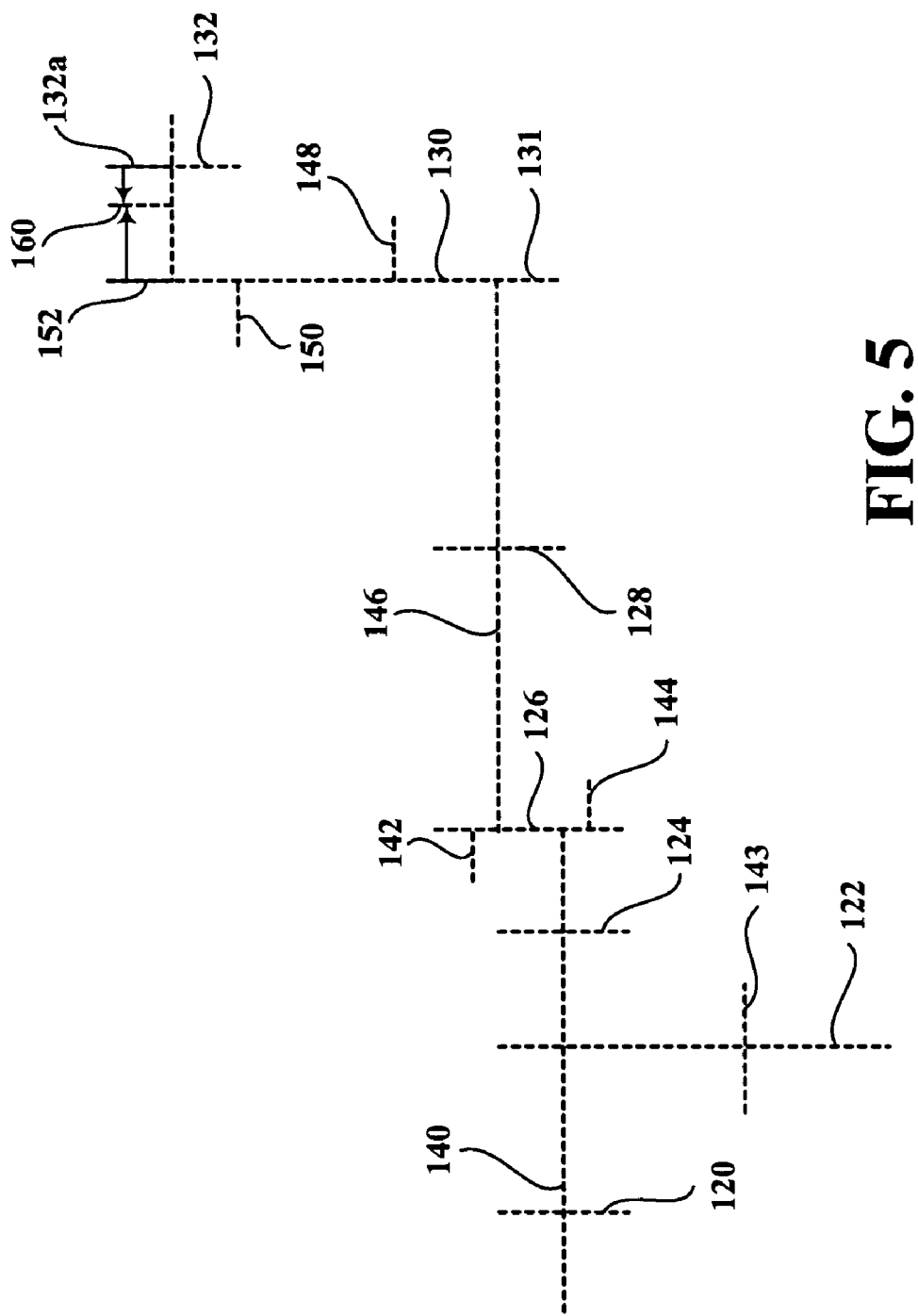
FIG. 5 illustrates an operation where parallel filaments are merged in accordance with one embodiment of the present invention.

FIG. 5 illustrates an operation where parallel filaments are merged in accordance with one embodiment of the present invention. In this operation, once the vertical filaments 120, 122, 124, 126, 128, 130, and 132 have been connected, the parallel connected filaments such as, for example, filaments 132a and 152 are merged in a merged filament 160. It should be appreciated that example of the specific merging as referenced in the discussion of FIG. 5 is exemplary in nature and other filaments in similar configurations may be merged. In one embodiment, the parallel filaments that are connected at the midpoint by a connection are merged. Therefore, in one embodiment, when the parallel filaments with their resulting widths touch each other due to wire width, the filaments are merged in the layout depiction. When the filaments are in series then there is no reason to merge. In one embodiment, parallel connected filaments 132a and 152 are merged such as example near port out_2. The width of the merged filament 160 is the sum of the width of filaments 152 and 132A. Filament 160 is in the center of the area previously covered by filaments 152 and 132a. In FIG. 5, the parallel filaments have been merged and the outline of the rectangles have been removed. In addition, the ports have been inserted.

Figure 6:
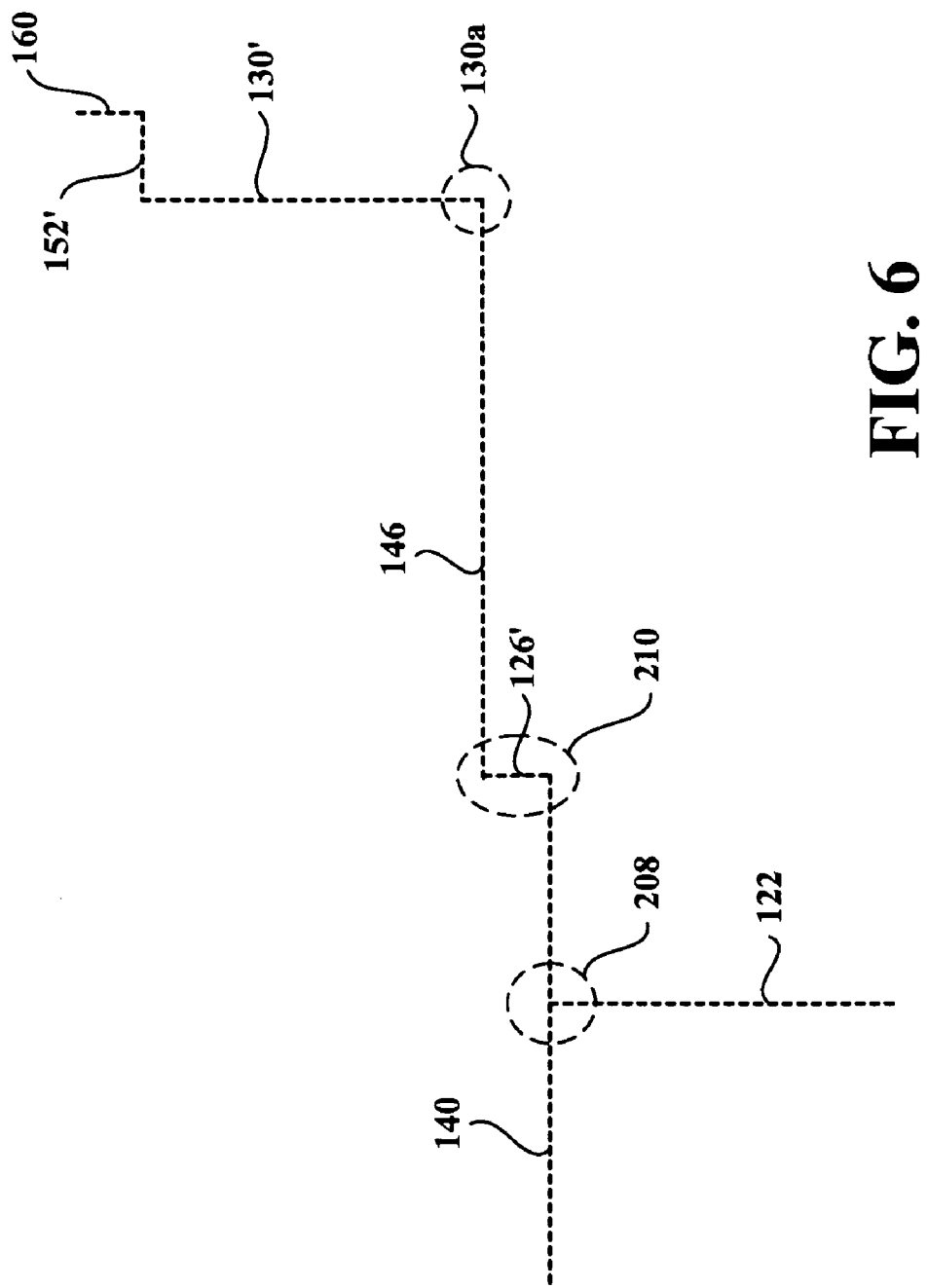
FIG. 6 shows an operation where open filaments are removed in accordance with one embodiment of the present invention.

FIG. 6 shows an operation where open filaments are removed in accordance with one embodiment of the present invention. In one embodiment, all open filaments such as, for example the filaments 120, 124, 128, 132, 142, 143, 144, 148, and 150 which were covered by another filament are removed. Filaments may be considered to be open if the particular filament is the only filament connected to a particular node which is not a port. Therefore, in one embodiment, open filaments have one node which has only one filament connected to it. As a result, if one node is connected by only one filament and the filament is covered by other filaments then that filament can be removed. A filament is a line with a start point and an endpoint and a width. Any point within a distance of the width/2 from the line and above the start point and below the endpoint is "covered." The area of a filament is a rectangle width*length (distance between start and endpoint). In one embodiment, one filament is "covered" when its area is fully enclosed by another filament area.

A filament such as, for example, filament 131 in FIG. 5 located at a corner such as, for example, a region 130a, is implicitly assumed to be covered and therefore may be removed. The structure shown in FIG. 6 may be described as a pruned filament representation. The definitions as described below in reference to FIG. 7 may be used to determine examine a bend region to determine an appropriate filament structure for the bend region.

Figure 7:
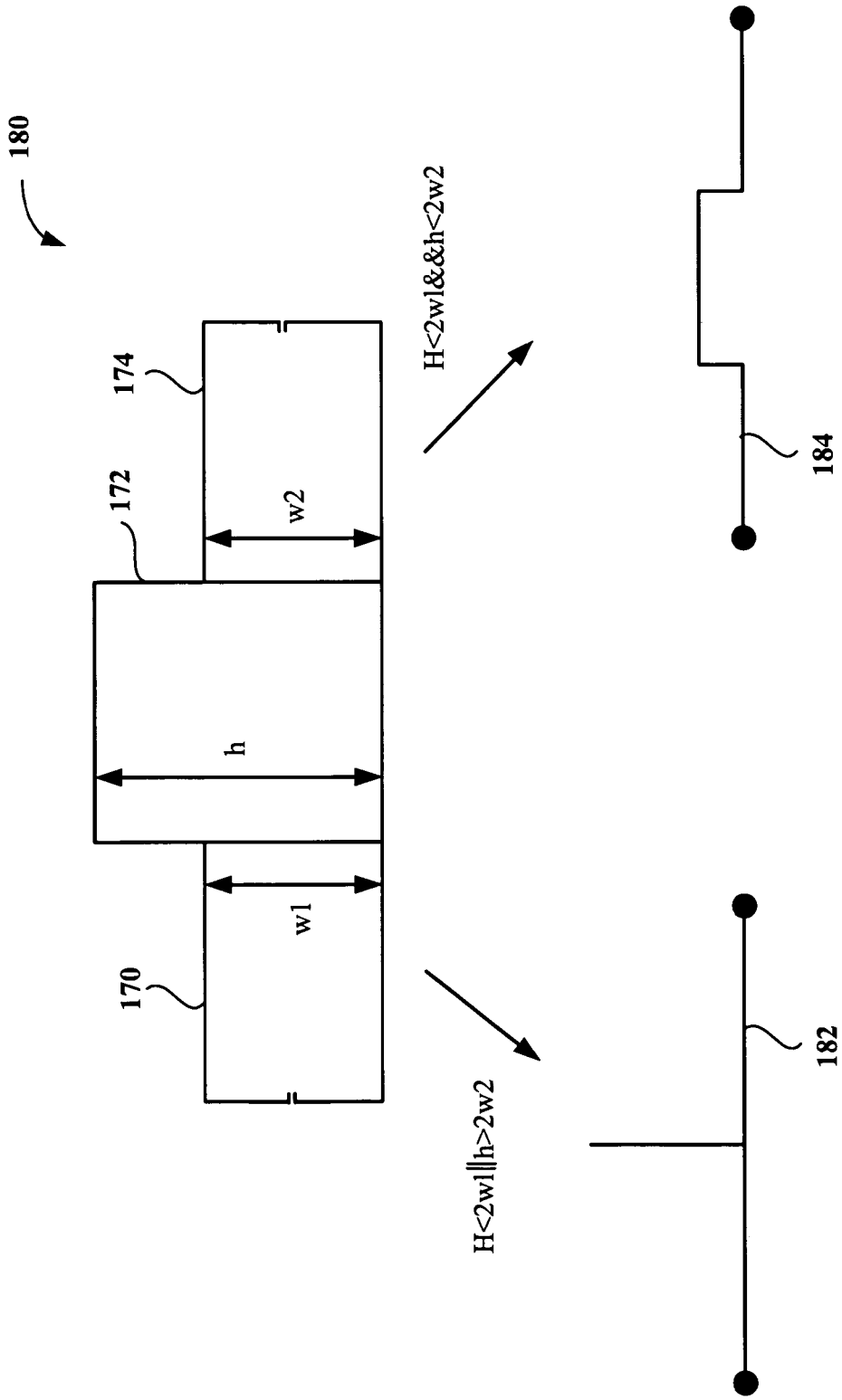
FIG. 7 illustrates an operation where a wire width and a wire height are examined to determine a filament structure in accordance with one embodiment of the present invention.
Figure 8:
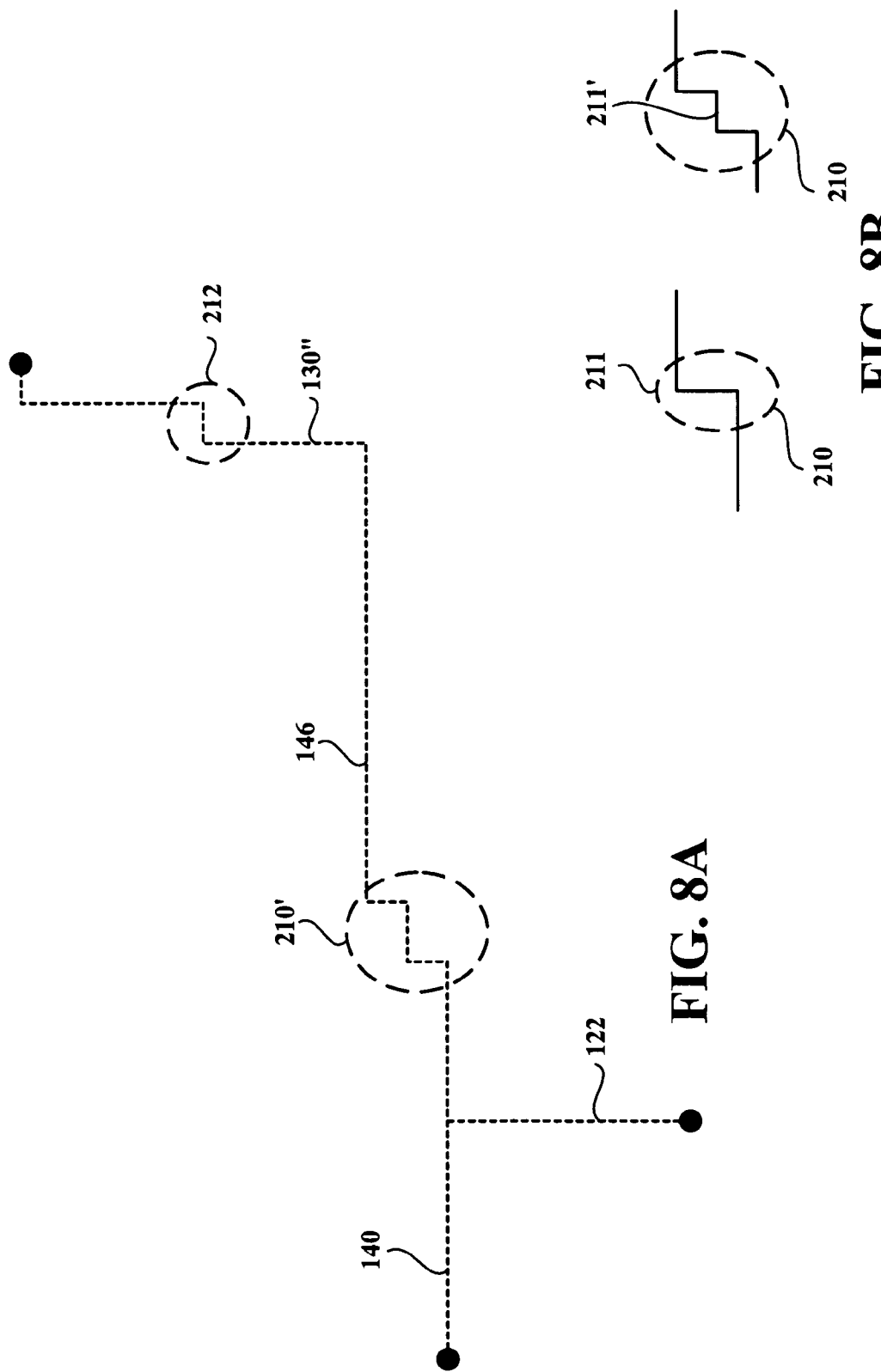
FIG. 8A shows a rearrangement of a filament structure in filament bend regions and accordance with one embodiment of the present invention.
FIG. 8B illustrates a modification of a filament structure in the filament bend region being modified to a filament structure in the filament bend region in accordance with one embodiment of the present invention.

FIG. 7 illustrates an operation where a wire width and a wire height are examined to determine a filament structure in accordance with one embodiment of the present invention. FIG. 7 may represent geometric representations of how to re-arrange bends (e.g., t-junctions, jog, change wire width, etc.) within the filament structure. In one embodiment, the structure shown in FIG. 7 shows a width of a vertical filament 170, a height of a vertical filament 172, and a width of a vertical filament 174. In one embodiment, geometric changes such as, for example, bends within the structure may be represented by a t-junction (e.g., a horizontal filament connected to a vertical open ended filament) or represented as change in wire width resulting in a step formation (e.g., changing of center) which would result in a different resistance. To decide which one of the geometric representation of a bend to use, the width and height in adjacent filaments are examined. In one embodiment, when the height in the vertical filament 172 is less than twice the width of the vertical filament 170 or less than twice of the width of the vertical filament 174 then a step structure 184 is incorporated into the filament structure. An exemplary step filament structure inserted in to the filament structure is shown in FIG. 8. If the height of the vertical filament 172 is more than twice the width of the vertical filament 170 and more than twice the width of the vertical filament 174 then a floating filament structure 182 (e.g. a t-junction) is indicated. For example, in the first bend as shown by filament bend region 208 of FIG. 6, a floating filament arrangement may be utilized as shown in FIG. 8 while in a filament bend region 210 of FIG. 6, a step arrangement may be utilized as shown in FIG. 8. A length of the filaments may be examined to determine where to place the modified structure filament (e.g., step structure).

FIG. 8A shows a rearrangement of a filament structure in filament bend regions 210 and 212 accordance with one embodiment of the present invention. The bends are re-arranged according to the definition(s) as discussed above in further reference to FIG. 7. In one embodiment, the algorithm separates geometry extraction and application of resistor models. Therefore, when the geometry extraction as shown in FIGS. 1 through 8 is completed, mathematical resistor model(s) known to those skilled in the art may be utilized to determine parasitic resistance of the wire topology. Consequently, in one example, known models for t-junction and bends may be utilized to determine the parasitic resistance after the methodology described above in reference to geometric extraction has been completed.

FIG. 8B illustrates a modification of a filament structure 211 in the filament bend region 210 being modified to a filament structure 211' in the filament bend region 210 in accordance with one embodiment of the present invention. In one embodiment, the operation where a wire width and a wire height are examined to determine a filament structure as described in further detail in reference to FIG. 7 is applied to filament structure 211. In one exemplary filament structure modification operation, by application of the operation of FIG. 7, the filament structure 211' may be generated where a step structure is generated within the bend region 210.

Figure 9:
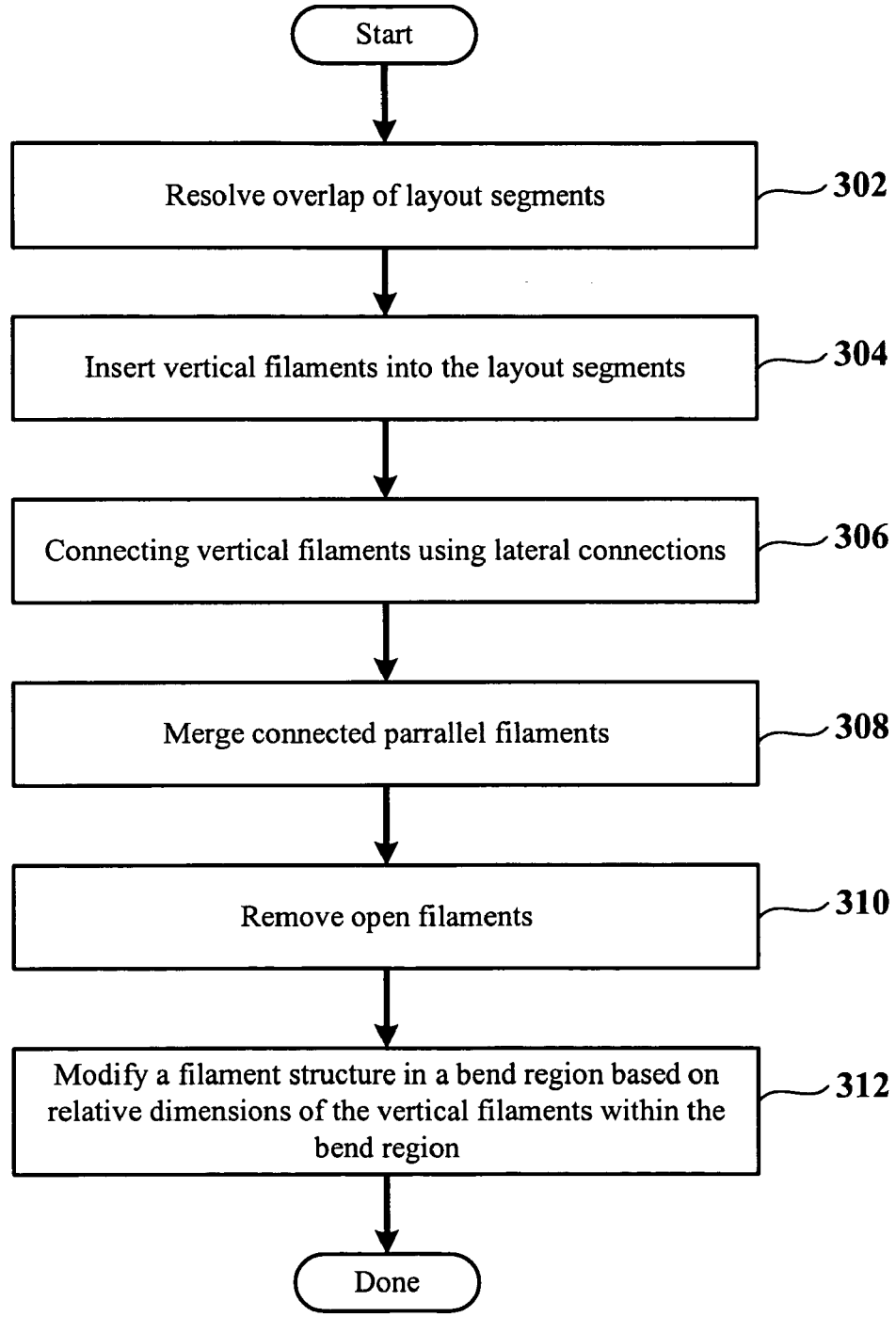
FIG. 9 shows a flowchart defining a method for converting a wire layout geometry to a filament topology which can be utilized to extract full chip resistance in accordance with one embodiment of the present invention.

FIG. 9 shows a flowchart 300 defining a method for converting a wire layout geometry to a filament topology which can be utilized to extract full chip resistance in accordance with one embodiment of the present invention. It should be understood that the processes depicted in the flowchart 300 may be in a program instruction form written on any type of computer readable media. For instance, the program instructions can be in the form of software code developed using any suitable type of programming language. For completeness, the process flow of FIG. 9 will illustrate an exemplary process whereby geometric methods are utilized to analyze a filament structure and generate a chip resistance model.

In one embodiment, the method begins with operation 302 where overlap of layout segments are resolved. After operation 302, the method moves to operation 304 where vertical filaments are inserted into the layout segments. Then operation 306 connects vertical filaments with lateral connections. After operation 306, the method proceeds to operation 308 where connected parallel filaments are merged. Then the method advances to operation 310 which removes open filaments. After operation 310, the method moves to operation 312 where a filament structure in a bend region is modified based on relative dimensions of the vertical filaments within the bend region. The user-specified definition may any suitable definition that can show a layout which can be analyzed in accordance with the methodologies described herein. In one embodiment, the user-specified definition may be such as those described in further detail in reference to FIG. 7 where a step or a floating filament structure may be utilized depending on the dimensions of filaments where a bend takes place. After operation 312, resistor models may be applied to the filament structure generated by the flowchart of FIG. 9 to obtain parasitic resistance of the wire topology.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method to convert a wire layout geometry to a filament topology for determination of chip resistance, comprising:
   resolving overlap of layout segments of the wire layout geometry;
   inserting a vertical filament into each of the layout segments;
   connecting vertical filaments using lateral connections;
   merging connected parallel filaments;
   removing open filaments; and
   modifying a filament structure in a bend region based on relative dimensions of the vertical filaments within the bend region.

2. A method to convert a wire layout geometry to a filament topology for determination of chip resistance as recited claim 1, wherein resolving the overlap of layout segments includes eliminating overlaps of the segments.

3. A method to convert a wire layout geometry to a filament topology for determination of chip resistance as recited claim 1, wherein inserting the vertical filament into each of the layout segments includes adding the vertical filament in a midpoint location between a first node of the segment and a second node of the segment.

4. A method to convert a wire layout geometry to a filament topology for determination of chip resistance as recited claim 1, wherein connecting vertical filaments using lateral connections includes one of:
   connecting a vertical filament and an open node, or
   connecting a vertical filament and another vertical filament.

5. A method to convert a wire layout geometry to a filament topology for determination of chip resistance as recited claim 1, wherein merging parallel filaments includes merging parallel filaments which are touching at a juncture between the parallel filaments.

6. A method to convert a wire layout geometry to a filament topology for determination of chip resistance as recited claim 1, wherein merging parallel filaments includes designating a merged filament as a juncture between the parallel filaments.

7. A method to convert a wire layout geometry to a filament topology for determination of chip resistance as recited claim 1, wherein modifying the filament structure in the bend region based on relative dimensions of the vertical filaments within the bend region includes generating a step filament structure in the bend region when a width of a first vertical filament is less than a half of a height of an adjacent vertical filament and when a width of a second vertical filament less than a half of the height of the adjacent vertical filament.

8. A method to convert a wire layout geometry to a filament topology for determination of chip resistance as recited claim 1, wherein modifying the filament structure in the bend region based on relative dimensions of the vertical filaments within the bend region includes generating a floating filament structure in the bend region when a width of a first vertical filament is greater than twice a height of an adjacent vertical filament or when a width of a second vertical filament is greater than twice the height of the adjacent vertical filament.

9. A computer readable media having program instructions to convert a wire layout geometry to a filament topology for determination of chip resistance, the computer readable media comprising:
   program instructions for resolving overlap of layout segments;

program instructions for inserting a vertical filament into each of the layout segments;

program instructions for connecting vertical filaments using lateral connections;

program instructions for merging connected parallel filaments;

program instructions for removing open filaments; and program instructions for modifying a filament structure in a bend region based on relative dimensions of vertical filaments within the bend region.

10. A computer readable media as recited in claim 9, wherein the program instructions for resolving the overlap of layout segments include program instructions for eliminating overlaps of the segments.

11. A computer readable media as recited in claim 9, wherein program instructions for inserting the vertical filament into each of the layout segments includes adding vertical filaments in a midpoint location between a first node of the segment and a second node of the segment.

12. A computer readable media as recited in claim 9, wherein program instructions for connecting vertical filaments with lateral connections includes:

program instructions for connecting a vertical filament with an open node, and program instructions for connecting a vertical filament with another vertical filament.

13. A computer readable media as recited in claim 9, wherein program instructions for merging parallel filaments includes program instructions for merging parallel filaments which are touching at a juncture between the parallel filaments.

14. A computer readable media as recited in claim 9, wherein program instructions for merging parallel filaments includes program instructions for designating a merged filament as a juncture between the parallel filaments.

15. A computer readable media as recited in claim 9, wherein program instructions for modifying the filament structure in the bend region based on relative dimensions of the vertical filaments within the bend region includes program instructions for generating a step filament structure in the bend region when a width of a first vertical filament is less than a half of a height of an adjacent vertical filament and when a width of a second vertical filament less than a half of the height of the adjacent vertical filament.

16. A computer readable media as recited in claim 9, wherein program instructions for modifying the filament structure in the bend region based on relative dimensions of the vertical filaments within the bend region includes program instructions for generating a floating filament structure in the bend region when a width of a first vertical filament is greater than twice a height of an adjacent vertical filament or when a width of a second vertical filament is greater than twice the height of the adjacent vertical filament.

17. A method to convert a wire layout geometry to a filament topology for determination of chip resistance, comprising:

resolving overlap of layout segments;

inserting a vertical filament into each of the layout segments;

connecting vertical filaments using lateral connections;

merging connected parallel filaments;

removing open filaments; and modifying a filament structure within a bend region including generating a particular filament structure in the bend region, the particular filament structure corresponding to particular dimensional ratios of the vertical filaments within the bend region.

18. A method to convert a wire layout geometry to a filament topology for determination of chip resistance as recited claim 17, wherein resolving the overlap of layout segments include eliminating overlaps of the segments.

19. A method to convert a wire layout geometry to a filament topology for determination of chip resistance as recited claim 17, wherein inserting vertical filaments into the layout segments includes adding vertical filaments in a midpoint location between a first node of the segment and a second node of the segment.

20. A method to convert a wire layout geometry to a filament topology for determination of chip resistance as recited claim 17, wherein connecting vertical filaments with lateral connections includes one of:

connecting a vertical filament with an open node, or connecting a vertical filament with another vertical filament.

21. A method to convert a wire layout geometry to a filament topology for determination of chip resistance as recited claim 17, wherein merging parallel filaments includes merging parallel filaments which are touching at a juncture between the parallel filaments.

22. A method to convert a wire layout geometry to a filament topology for determination of chip resistance as recited claim 17, wherein merging parallel filaments includes designating a merged filament as a juncture between the parallel filaments.

23. A method to convert a wire layout geometry to a filament topology for determination of chip resistance as recited claim 17, wherein generating the particular filament structure in the bend region includes generating a step filament structure in the bend region when a width of a first vertical filament is less than a half of a height of an adjacent vertical filament and when a width of a second vertical filament less than a half of the height of the adjacent vertical filament.

24. A method to convert a wire layout geometry to a filament topology for determination of chip resistance as recited claim 17, wherein generating the particular filament structure in the bend region includes generating a floating filament structure in the bend region when a width of a first vertical filament is greater than twice a height of an adjacent vertical filament or when a width of a second vertical filament is greater than twice the height of the adjacent vertical filament.

* * * * *